United States Patent
Gardner et al.

[11] Patent Number: 5,976,952
[45] Date of Patent: Nov. 2, 1999

[54] IMPLANTED ISOLATION STRUCTURE FORMATION FOR HIGH DENSITY CMOS INTEGRATED CIRCUITS

[75] Inventors: Mark I. Gardner, Cedar Creek; Mark C. Gilmer, Austin, both of Tex.

[73] Assignee: Advanced Micro Devices, Inc.

[21] Appl. No.: 08/812,320

[22] Filed: Mar. 5, 1997

[51] Int. Cl.⁶ .................................................. H01L 21/76
[52] U.S. Cl. ...................... 438/440; 438/439; 438/294; 438/528
[58] Field of Search ............................... 438/440, 439, 438/444, 528, 294

[56] References Cited

U.S. PATENT DOCUMENTS

| | | |
|---|---|---|
| 4,437,225 | 3/1984 | Mizutani . |
| 4,863,878 | 9/1989 | Hite et al. . |
| 4,948,742 | 8/1990 | Nishimura et al. . |
| 5,182,226 | 1/1993 | Jang ........................................ 438/440 |
| 5,346,841 | 9/1994 | Yajima . |
| 5,441,094 | 8/1995 | Pasch . |
| 5,472,902 | 12/1995 | Lur . |
| 5,488,004 | 1/1996 | Yang . |
| 5,494,846 | 2/1996 | Yamazaki . |
| 5,707,899 | 1/1998 | Cerofolini et al. . |
| 5,712,186 | 1/1998 | Thakur et al. ........................... 438/440 |

FOREIGN PATENT DOCUMENTS

| | | |
|---|---|---|
| 56-111243 | 9/1981 | Japan . |
| 60-133740 | 7/1985 | Japan . |
| 61-228652 | 10/1986 | Japan . |
| 63-110658 | 5/1988 | Japan . |
| 63-280438 | 11/1988 | Japan . |
| 3-24727 | 2/1991 | Japan . |
| 4-61340 | 2/1992 | Japan . |
| 5-218192 | 8/1993 | Japan . |

OTHER PUBLICATIONS

Ghandhi, *VLSI Fabrication Principles*, John Wiley & Sons 1983, pp. 348–352.

*Primary Examiner*—Trung Dang
*Attorney, Agent, or Firm*—Kevin L. Daffer; Conley, Rose & Tayon

[57] ABSTRACT

A semiconductor process in which oxygen is selectively implanted into isolation regions of a semiconductor substrate and subsequently annealed to form isolation structures within the isolation regions. Preferably, a semiconductor substrate is provided and a pad oxide layer is deposited on the semiconductor substrate. A barrier layer is then deposited on the pad oxide layer and a photoresist layer is formed over the barrier layer and patterned to form a photoresist mask. The photoresist mask is aligned over active regions of the semiconductor substrate. An oxygen bearing species is then introduced to an isolation region of the semiconductor substrate. The isolation region is laterally displaced between the active regions. The introducing of the oxygen bearing species into the isolation region results in the formation of an oxygenated region of the semiconductor substrate. Thereafter, the semiconductor substrate is annealed to react the oxygen bearing species with the semiconductor substrate atoms within the isolation region thereby forming an isolation oxide within the isolation region. The introduction of the oxygen bearing species into the semiconductor substrate preferably is accomplished by implanting oxygen ions into the substrate. In one embodiment the annealing of the semiconductor substrate is accomplished by immersing the semiconductor substrate in an ambient maintained at a temperature in the range of approximately 600° C. to 900° C. for a duration in the range of approximately 2 to 20 minutes. In another embodiment, the annealing the semiconductor substrate is accomplished during subsequent fabrication processing such that the annealing requires no dedicated processing step.

24 Claims, 4 Drawing Sheets

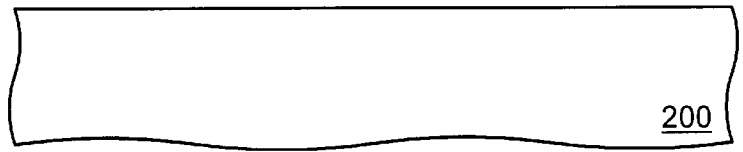
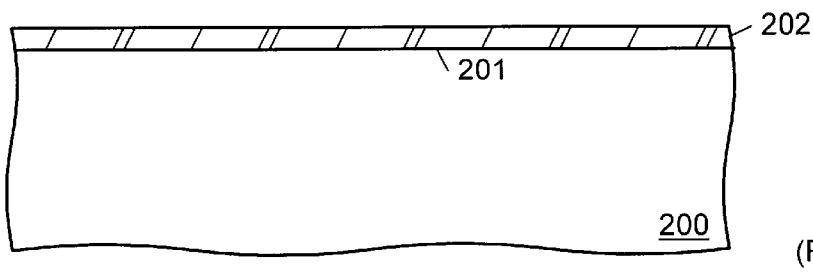
FIG. 2a (PRIOR ART)
FIG. 2b (PRIOR ART)
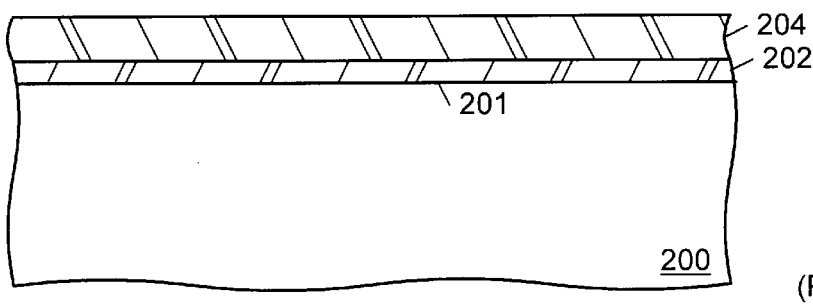
FIG. 2c (PRIOR ART)
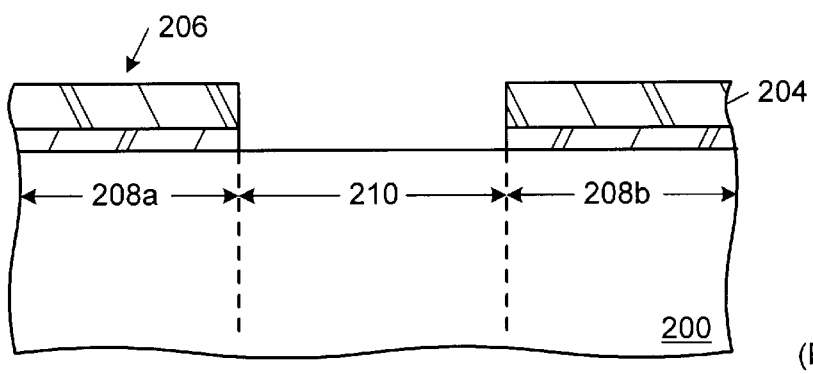
FIG. 2d (PRIOR ART)
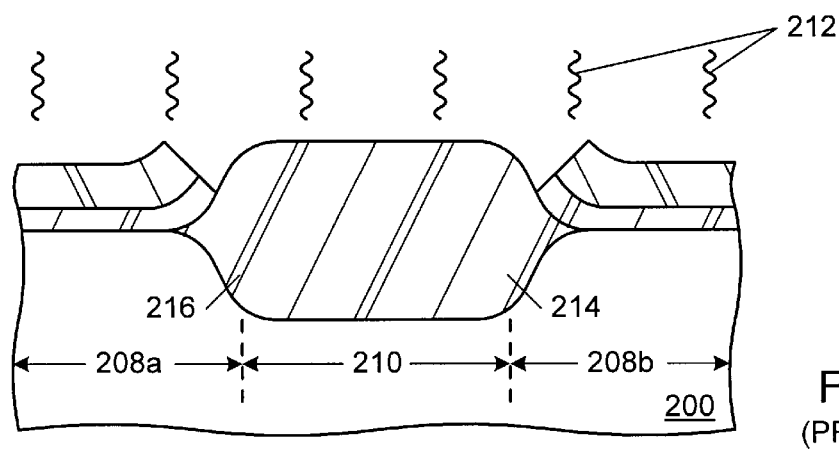
FIG. 2e (PRIOR ART)

5,976,952

IMPLANTED ISOLATION STRUCTURE FORMATION FOR HIGH DENSITY CMOS INTEGRATED CIRCUITS

BACKGROUND OF THE INVENTION

1. Field of the Invention

The present application relates to the field of semiconductor processing and more particularly to a method of forming isolation structures within a semiconductor substrate using an oxygen implant.

2. Description of the Relevant Art

In an integrated circuit, a plurality of semiconductor transistors are fabricated on a monolithic substrate typically comprised of a semiconductor such as silicon or gallium arsenide. The plurality of transistors are subsequently selectively coupled to one another to achieve a desired circuit. To prevent inadvertent coupling of neighboring transistors, isolation structures must be used to physically and electrically isolate each of the individual transistors. Well developed processes for isolating transistors are well known within the field of semiconductor processing. Referring to FIGS. 2a through 2f, the local oxidation of silicon (LOCOS) process is shown. In FIG. 2a semiconductor substrate 200 is provided and a pad oxide layer 202 is then formed on upper surface 201 of semiconductor substrate 200 as shown in FIG. 2b. Pad oxide 202 typically requires a dedicated processing step in which the pad oxide 202 is either grown in a thermal oxidation tube or deposited within a thin film deposition apparatus.

Silicon nitride layer 204, as shown in FIG. 2c, is then deposited upon pad oxide layer 202. Nitride layer 204 is then patterned to form a patterned nitride layer 206 as shown in FIG. 2d. Patterned nitride layer 206 is formed such that the nitride portions of the layer are aligned over first and second active regions 208a and 208b respectively of semiconductor substrate 200. The patterning of silicon nitride layer 204 is typically accomplished with a photolithography masking step and a corresponding nitride etch step. After silicon nitride layer 204 has been patterned appropriately, a thermal oxidation process represented in FIG. 2e by reference numeral 212 is performed to grow an isolation oxide 214 substantially within isolation region 210 of semiconductor substrate 200. As is well known in the field of semiconductor processing, subjecting a silicon substrate to a high temperature oxygen bearing ambient in the presence of a patterned silicon nitride mask results in the selective oxidation of the silicon surface in those regions of the silicon substrate where the silicon nitride has been removed. It is also well known that thermal oxidation of silicon characteristically results in a first portion of the oxide being contained below the upper surface of the original silicon substrate while a second portion of the resulting oxide is formed above the original surface of the silicon substrate. Typically, the oxidation process required to grow isolation oxide 214 requires subjecting silicon substrate to a heated ambient for a duration typically in excess of 60 minutes. This comparatively long thermal oxidation process consumes valuable resources of the fabrication facility for extended periods of time. In addition, the local oxidation process is well known for producing "birds beak" structures 216 at the lateral edges of the isolation oxide 214. The birds beak structures 216 undesirably encroach upon active regions 208a and 208b of silicon substrate 200 thereby reducing the maximum obtainable transistor density. After formation of isolation oxide 214, patterned nitride mask 206 is typically stripped from the wafer resulting in the partial cross-sectional view shown in FIG. 2f. In addition to the problems characteristic of the LOCOS process noted above, the LOCOS process results in a non-planar upper surface 215 defined by upper surface 201 of semiconductor substrate 200 and the upper surface of isolation oxide 214. Non-planar surfaces are undesirable because they tend to increase the difficulty of manufacturing subsequent layers of the integrated circuit. Photolithography steps, for example, are limited by the depth of field of the photolithography equipment. Exposing a non-planar photoresist layer may result in unwanted line width variation in the regions of non-planarity.

In an attempt to eliminate the long oxidation process required by the LOCOS method and to address the undesirably non-planar surface that results from the LOCOS process, semiconductor manufacturers have typically turned to shallow trench isolation (STI) isolation processes as shown in FIGS. 1a through 1e. FIG. 1a shows semiconductor substrate 100. Semiconductor substrate 100 includes an isolation region 104 laterally displaced between first and second active regions 102a and 102b. In FIG. 1b, an isolation trench 106 is etched into isolation region 104 of semiconductor substrate 100. The isolation trench process is preceded by a photoresist masking step that permits the selective etching of portions of semiconductor substrate 100 within isolation region 104. Care must be taken during the formation of isolation trench 106 to ensure that the trench sidewalls are substantially vertical to minimize the encroachment of isolation trench 106 into active regions 102a and 102b of semiconductor substrate 100. In addition, conventional etch technology places an upper limit on the aspect ratio of isolation trench 106. The aspect ratio refers to the ratio of the trench depth d to the trench width w. Typically, trenches with aspect ratios greater than approximately 1 are more difficult to fabricate than trenches with aspect ratios less than 1. This constraint places an upper limit on the depth d or, alternatively, a lower limit on the width w of isolation trench 106. Both of these constraints are undesirable as deeper trenches are preferred to shallow trenches because deeper trenches result in more effective isolation between adjacent active regions while narrower trenches are preferred because they permit higher density transistor formation.

Turning now to FIG. 1c, a thin thermal oxide 108 is typically grown after the formation of isolation trench 106 to place a thermal oxide layer at the sidewalls and floor of isolation trench 106. The formation of thermal dielectric 108 is believed to result in a more reliable isolation structure, but requires a dedicated thermal oxidation process. Turning to FIG. 1d, a trench dielectric layer 110 is typically deposited over the topography defined by semiconductor substrate 100 and isolation trench 106. The deposition of trench dielectric layer 110 is typically accomplished by a dedicated thin film deposition process. Subsequently, a planarization process is typically required to remove portions of trench dielectric layer 110 exterior to isolation trench 106. The complete planarization of trench dielectric 110 may require multiple processing steps including one or more chemical mechanical polish steps possibly in combination with one or more photolithography masking steps and wet or dry etch steps. FIG. 1e shows an idealized shallow trench isolation structure 114 laterally situated between a pair of active regions 102a and 102b of a semiconductor substrate 100. It will be appreciated to those skilled in the art that the shallow trench isolation process addresses the long oxidation cycle required by LOCOS processing and generally produces a more planar upper surface than is possible with the LOCOS. Nevertheless, the shallow isolation process requires a dedicated isolation etch step, a thermal oxidation step, a thin film deposition step, and one or more planarization steps. As noted previously, the geometry of the shallow trench isolation structure itself is typically limited by the capabilities of the etch process. In summary, the shallow trench isolation process offers advantages over the LOCOS isolation process but, nevertheless, includes significant processing overhead and may inherently possess process limitations that could prove to be significant as the geometries of isolation structures are reduced.

It is therefore desirable to implement an isolation process which significantly reduces the amount of processing overhead and expense typically required of conventional isolation processes. In addition, it is desirable to utilize an isolation process free of the geometric constraints imposed by LOCOS and STI process flows.

SUMMARY OF THE INVENTION

The problems identified above are in large part addressed by a semiconductor process in which oxygen is selectively implanted into isolation regions of a semiconductor substrate and subsequently annealed to form isolation structures within the isolation regions. In one embodiment, the anneal can be accomplished with a dedicated processing step while, in another embodiment, the anneal may be integrated into during subsequent processing steps.

Broadly speaking, the present invention contemplates a semiconductor manufacturing process in which a semiconductor substrate is provided and pad oxide layer is deposited on the semiconductor substrate. A barrier layer is then deposited on the pad oxide layer and a photoresist layer is formed over the barrier layer and patterned to form a photoresist mask. The photoresist mask is aligned over active regions of the semiconductor substrate. An oxygen bearing species is then introduced to an isolation region of the semiconductor substrate. The isolation region is laterally displaced between the active regions. The introducing of the oxygen bearing species into the isolation region results in the formation of an oxygenated region of the semiconductor substrate. Thereafter, the semiconductor substrate is annealed to react the oxygen bearing species with the semiconductor substrate atoms within the isolation region thereby forming an isolation oxide within the isolation region.

Preferably, the semiconductor substrate is a single crystal silicon lattice, and still more preferably, the semiconductor substrate includes a p-type epitaxial layer formed on p+ silicon bulk. A resistivity of the p-type epitaxial layer is preferably in the range of approximately 10 to 15 Ω-cm. The depositing of the pad oxide in a preferred embodiment comprises the step of decomposing TEOS in a chemical vapor deposition reaction chamber maintained at a temperature in the range of approximately 650° C. to 800° C. and a pressure of less than approximately 2 torrs to produce silicon nitride.

The deposition of the barrier layer preferably includes step of reacting silane and $NH_3$ in a chemical vapor deposition reactor chamber maintained at a temperature in the range of approximately 700° C. to 900° C. and a pressure of less than approximately 2 torrs. The introduction of the oxygen bearing species into the semiconductor substrate preferably is accomplished by implanting oxygen ions into the substrate. In one embodiment, the implant dose is in the range of a approximately $10^{13}$ to $10^{17}$ atoms/cm$^2$. Preferably, the implant energy used during the oxygen implant is in the range of approximately 10 to 100 keV. In one embodiment the annealing of the semiconductor substrate is accomplished by immersing the semiconductor substrate in an ambient maintained at a temperature in the range of approximately 600° C. to 900° C. for a duration in the range of approximately 2 to 20 minutes. In another embodiment, the annealing of the semiconductor substrate is accomplished during subsequent fabrication processing such that the annealing requires no dedicated processing step.

The present invention still further contemplates an isolation method used in a process for manufacturing integrated circuits. The method comprises the steps of providing a silicon substrate, depositing a pad oxide layer, depositing a silicon nitride layer, forming a patterned photoresist layer, implanting oxygen, and annealing the silicon substrate. The silicon substrate includes an isolation region laterally displaced between first and second active regions. The pad oxide layer is deposited on an upper surface of the silicon substrate and the silicon nitride layer is deposited on the pad oxide layer. The patterned photoresist layer is aligned over the active regions of this silicon substrate. The oxygen is selectively implanted into the isolation regions of the silicon substrate and the annealing of the silicon substrate reacts the oxygen with the silicon substrate within the isolation regions to form an isolation structure substantially contained within the isolation region.

The present invention still further contemplates a semiconductor isolation method in which an oxygen bearing species is selectively implanted into an isolation region of a silicon substrate. Thereafter the silicon substrate is annealed to react the oxygen bearing species with the silicon substrate to form a silicon-oxide isolation structure. In one embodiment, the annealing of the silicon substrate is accomplished during the formation of the first and second transistors within first and second active regions respectively of the silicon substrate such that the annealing step is integrated into the subsequent process flow thereby requiring no dedicated processing step.

BRIEF DESCRIPTION OF THE DRAWINGS

Other objects and advantages of the invention will become apparent upon reading the following detailed description and upon reference to the accompanying drawings in which:

FIG. 2a is a partial cross-sectional view of semiconductor substrate;

FIG. 2b is a processing step subsequent to FIG. 2a in which a pad oxide layer has been formed on an upper surface of the semiconductor substrate;

FIG. 2c is a processing step subsequent to FIG. 2b in which a silicon nitride layer has been deposited on the pad oxide layer;

FIG. 2d is a processing step subsequent to FIG. 2c in which the silicon nitride layer has been patterned to form a patterned silicon nitride mask aligned over active regions of the semiconductor substrate;

FIG. 2e is a processing step subsequent to FIG. 2d in which a thermal oxidation process results in the formation of an isolation oxide within the isolation region of the semiconductor substrate;

Figure 1A:
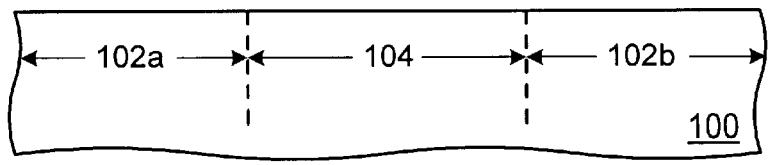
FIG. 1a is a partial cross-sectional view of semiconductor substrate.
Figure 1B:
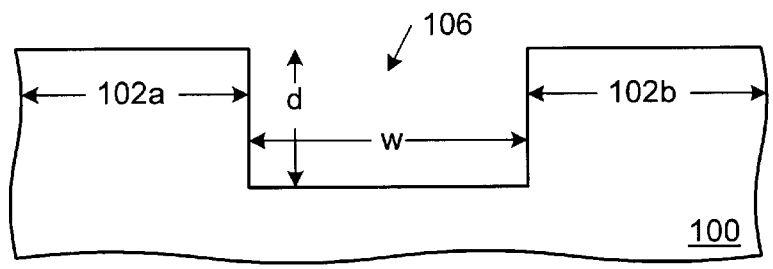
FIG. 1b is a processing step subsequent to FIG. 1a in which an isolation trench in etched into the semiconductor substrate.
Figure 1C:
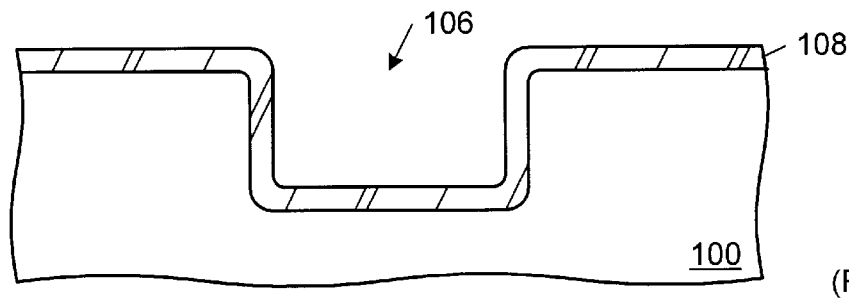
FIG. 1c is a processing step subsequent to FIG. 1b in which a thin thermal oxide layer is grown over the topography defined by the semiconductor substrate and the isolation trench.
Figure 1D:
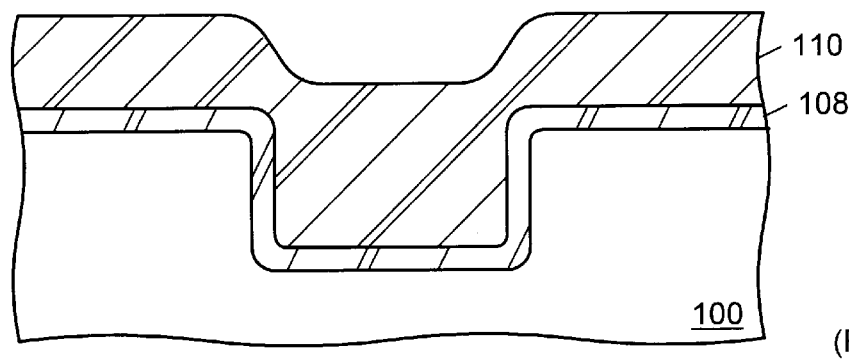
FIG. 1d is a processing step subsequent to FIG. 1c in which a trench dielectric is deposited within the trench.
Figure 1E:
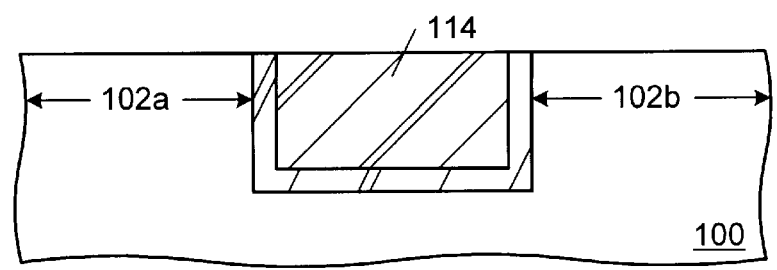
FIG. 1e is processing step subsequent to FIG. 1d in which the trench dielectric layer has been planarized to remove portions of the layer exterior to isolation trench 106.
Figure 2F:
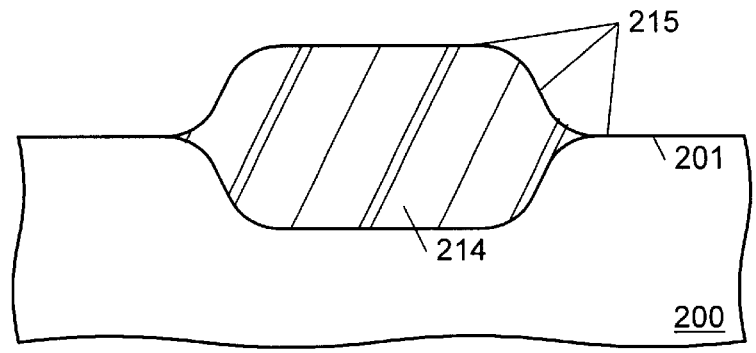
FIG. 2f is a processing step subsequent to FIG. 2e in which the patterned nitride layer has been stripped.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 3:
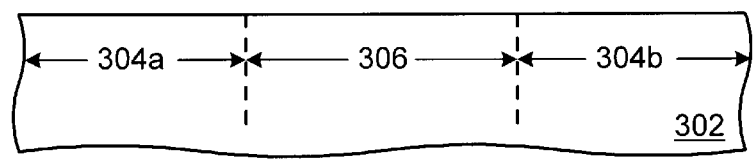
FIG. 3 is a partial cross-sectional view of a semiconductor substrate.

Turning now to the drawings, FIGS. 3 through 8 show a processing sequence for forming an isolation oxide 322 (shown in FIG. 7 and FIG. 8) in a semiconductor substrate 302. Isolation oxide 322 is laterally displaced between a first active region 304a and a second active region 304b of semiconductor substrate 302. Isolation oxide 322 physically separates and electrically isolates first active region 304a and second active region 304b. Turning now to FIG. 3, a semiconductor substrate 302 is provided. Semiconductor 302 includes a first active region 304a, a second active region 304b, and a isolation region 306 laterally displaced between the two active regions. In one embodiment, semiconductor substrate 302 is a single crystal silicon wafer. In a presently preferred embodiment useful for manufacturing CMOS integrated circuits, semiconductor substrate 302 includes a p-type epitaxial layer formed over a p+ silicon bulk. Preferably, a resistivity of the p-type epitaxial layer is in the range of approximately 10 to 15 $\Omega$-cm. The p+ silicon bulk includes a p-type dopant such as boron in a concentration exceeding approximately $10^{19}$ atoms/cm$^3$.

Figure 4:
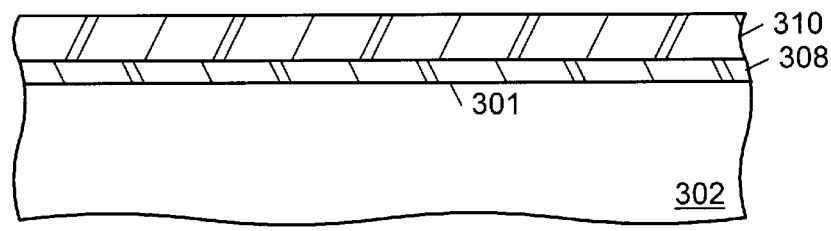
FIG. 4 is a processing step subsequent to FIG. 3 in which a pad oxide layer and a barrier layer have been formed on an upper surface of the semiconductor substrate.

Turning to FIG. 4, semiconductor substrate 302 is shown after a pad oxide layer 308 has been deposited on upper surface 301 of semiconductor substrate 302 and barrier layer 310 has been deposited on pad oxide layer 308. The deposition of pad oxide layer 308 is preferably accomplished by decomposing TEOS in a chemical vapor deposition reactor chamber. The reactor chamber is preferably maintained a temperature in the range of approximately 650° C. to 800° C. and a pressure of less than approximately 2 torrs during the deposition of pad oxide layer 308. A typical thickness of pad oxide layer 308 is in the range of approximately 50 to 250 angstroms. After the formation of pad oxide layer 308, barrier layer 320 is preferably formed by decomposing a mixture of silane and NH$_3$ in a CVD reactor chamber to deposit a silicon nitride layer. The chamber is maintained at a temperature in the range of approximately 700° C. to 900° C. and a pressure of less than approximately 2 torrs during the deposition of barrier layer 310.

Figure 5:
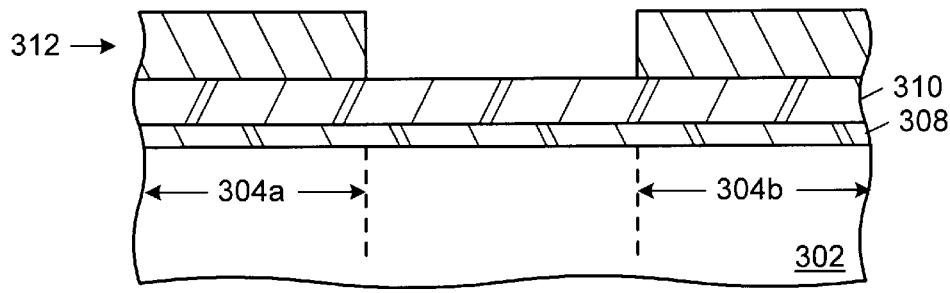
FIG. 5 is a processing step subsequent to FIG. 4 in which a patterned photoresist mask has been formed over the barrier layer such that the photoresist mask is aligned over active regions of the semiconductor substrate.
Figure 6:
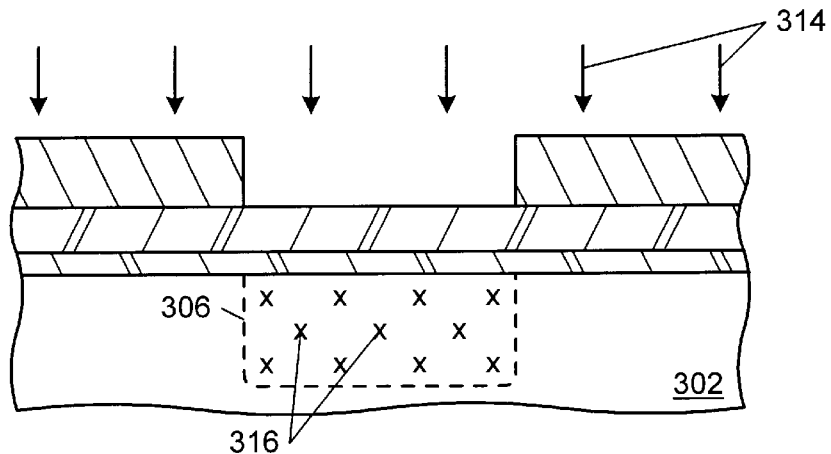
FIG. 6 is a processing step subsequent to FIG. 5 in which an oxygen bearing species has been introduced into isolation regions of the semiconductor substrate.

Turning now to FIG. 5, a patterned photoresist layer 312 has been formed upon an upper surface of barrier layer 310. Patterned photoresist layer 312 is typically formed by spin depositing a photoresist layer and thereafter selectively exposing portions of the photoresist layer to an optical energy source through the use of a photo mask and an optical aligner all as are well known in the field of semiconductor processing. Pattern mask 312 as shown in FIG. 5 is aligned over active regions 304 of semiconductor substrate 302. Turning to FIG. 6, an oxygen bearing species 316 is introduced through barrier layer 310 and pad oxide layer 308 into isolation region 306 of semiconductor substrate 302. In a presently preferred embodiment, the introduction of oxygen bearing species 316 into isolation region 306 is accomplished through the use of an ion implantation step represented as reference numeral 314 in the drawing. In a preferred embodiment, ion implantation 314 is carried out using an implant dose in the range of approximately $10^{13}$ to $10^{17}$ atoms/cm$^2$. The preferred implant energy is in the range of approximately 10 to 100 keV. The preferred implant species is $O_2$, but it is to be understood that alternative oxygen bearing species may be substituted for $O_2$.

It will be appreciated to those skilled in the art that ion implantation of oxygen into isolation regions of the semiconductor substrate represents and improvement over the local oxidation and shallow trench isolation methods discussed previously. More specifically, the relative simplicity and lower cost of ion implantation step 314 represents a significant improvement over the extensive dedicated processing steps required to form isolation structures using the TI or LOCOS methods discussed previously. In addition, the use of ion implantation 314 may enable the formation of isolation oxides having aspect ratios greater than aspect ratios achievable using the shallow trench isolation method and eliminates the non-planarity associated with the local oxidation process.

Figure 7:
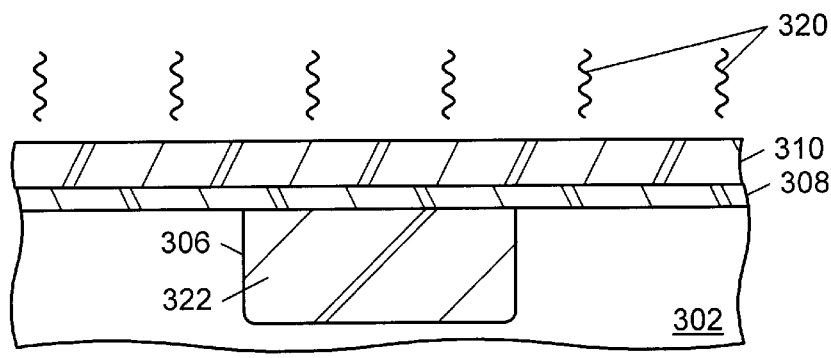
FIG. 7 is a processing step subsequent to FIG. 6 in which an anneal cycle is performed to react oxygen with the semiconductor substrate within the isolation region thereby forming an isolation structure.

Turning to FIG. 7, one embodiment of the invention contemplates a dedicated anneal cycle 320 to react oxygen bearing species 316 within isolation 306 with atoms of semiconductor substrate 302 to form isolation oxide 322. Because oxygen bearing species 316 is substantially contained within isolation region 306, isolation oxide 322 is likewise substantially contained within isolation region 306 of semiconductor substrate 302. In one embodiment, anneal cycle 320 comprises immersing semiconductor substrate 302 in a nitrogen bearing ambient maintained at a temperature in the range of approximately 600° C. to 900° C. A preferred duration of anneal cycle 320 is in the range of approximately 2 to 20 minutes. It will be appreciated to those skilled in the art of semiconductor processing that anneal cycle 320 may be alternatively carried out in a conventional oxidation/diffusion furnace or in a rapid thermal apparatus. Typically, the conventional oxidation/ diffusion furnace is a batch process with a plurality of semiconductor wafers are exposed to elevated temperature simultaneously. The rapid thermal apparatus typically processes each semiconductor substrate individually and is typically associated with a shorter duration and a higher temperature relative to the furnace type processes. In any event isolation oxide 322 electrically isolates first active region 304a from second active region 304b. For purposes of this application, electrical isolation implies that negligible current flows from first active region 304a to second active region 304b when a potential difference in the range of approximately 5 V is applied between the two active regions.

Figure 8:
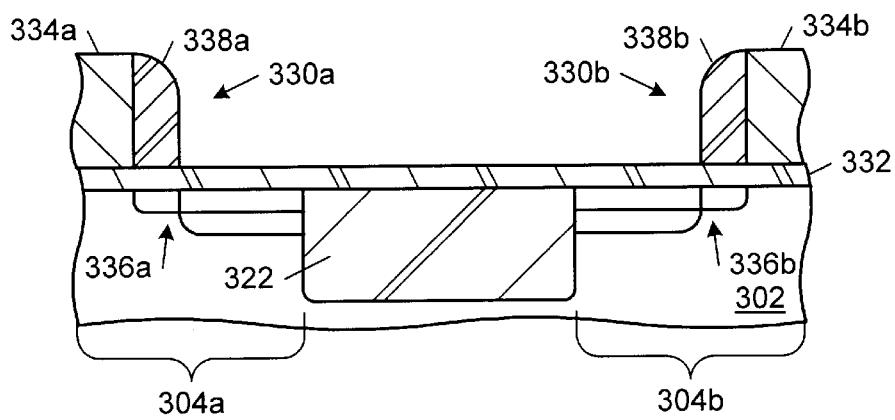
FIG. 8 is a alternative processing step subsequent to FIG. 7 in which first and second transistors are formed in first and second active regions of the semiconductor substrate.

FIG. 8 shows a partial cross-sectional view after to further processing in which a first transistor 330a and a second transistor 330b have been formed in first active regions 304a and second active regions 304b respectively. The formation of first and second transistors 330a and 330b is accomplished with well known processing techniques including the formation of a gate oxide layer 332, the deposition and formation of conductive gate structures 334a and 334b, and the formation of source/drain structures 336a and 336b. It will be appreciated by those skilled in the art that source/drain structures 336 as shown in FIG. 8 include the well known lightly doped drain regions typically achieved in conjunction with the presence of spacer structures 338a and 338b on the sidewalls of the conductive gate structures 334a and 334b respectively. One embodiment of the present invention contemplates additional process simplification by integrating the annealing of isolation region 306 of semiconductor substrate 302 with the processing steps associated with first and second transistors 330a and 330b thereby eliminating the dedicated anneal cycle. For example, the formation of gate oxide 332 is typically accomplished with a thermal oxidation process during which semiconductor substrate 302 is subjected to an ambient temperature in the range of approximately 600° C. to 900° C. This high temperature step may be sufficient to form isolation oxide 322. As another example, many CMOS processes include high temperature processing steps in conjunction with the formation of an n-well, a p-well, or possibly both. In a typical well formation process, an impurity distribution is implanted into semiconductor substrate 302 and thereafter driven in with a high temperature (i.e. >approximately 800° C.) processing step. If the well formation process and other front end processes are performed prior to the introduction of oxygen bearing species 316 into isolation region 306, any or all of the subsequent high temperature processing steps may be sufficient to react oxygen bearing species 316 with semiconductor substrate 302 to form isolation oxide 322. Accordingly, one embodiment of the present invention contemplates that the annealing of semiconductor substrate 302 required to form isolation oxide 322 within isolation region 306 is accomplished during the formation of first and second transistors 330a and 330b within active regions 304a and 304b. In this embodiment, the integration of the anneal process with the transistor formation process eliminates the dedicated anneal cycle from the isolation process flow.

It will be appreciated to those skilled in the art that the present invention contemplates a simplification and cost reduction in the process sequence required to form mandatory isolation regions within the semiconductor substrate of an integrated circuit. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor manufacturing process, comprising: providing a semiconductor substrate;
depositing a pad oxide layer on said semiconductor substrate;
depositing a barrier layer on said pad oxide layer;
depositing a photoresist layer on said barrier layer and patterning said photoresist layer to form a photoresist mask, wherein said photoresist mask is aligned over active regions of said semiconductor substrate;
introducing an oxygen bearing species through said barrier layer and said pad oxide layer into an isolation region of said semiconductor substrate, wherein said isolation region is laterally displaced between said active regions, and wherein said introducing results in the formation of an oxygenated region of said semiconductor substrate;
annealing said semiconductor substrate, wherein said oxygen bearing species reacts with atoms of said semiconductor substrate within said isolation region to form an isolation structure within said isolation region; and
stripping said barrier layer.

2. The process of claim 1, wherein said semiconductor substrate comprises a single crystal silicon lattice.

3. The process of claim 2 wherein said semiconductor substrate comprises a p-type epitaxial layer formed on a p+ silicon bulk, and wherein a resistivity of said p-type epitaxial layer is in the range of approximately 10 to 15 $\Omega$-cm.

4. The process of claim 1 wherein the step of depositing said pad oxide comprises decomposing TEOS in a chemical vapor deposition reactor chamber maintained at a temperature in the range of approximately 650 to 800° C. and a pressure of less than approximately 2 torrs.

5. The process of claim 1, wherein the step of depositing said barrier layer comprises reacting silane and $NH_3$ in a chemical vapor deposition reactor chamber maintained at a temperature in the range of approximately 700 to 900° C. and a pressure less than approximately 2 torrs.

6. The process of claim 1, wherein the step of introducing said oxygen bearing species comprises implanting ions of oxygen into said semiconductor substrate.

7. The process of claim 6, wherein an implant dose of said implanting is in the range of approximately $10^{13}$ to $10^{17}$ atoms/$cm^2$.

8. The process of claim 7, wherein an implant energy of said implanting is in the range of approximately 10 to 100 keV.

9. The process of claim 1, wherein the step of annealing said semiconductor substrate comprises immersing said semiconductor substrate into an ambient maintained at a temperature in the range of approximately 600 to 900° C. for approximately 2 to 20 minutes.

10. The process of claim 1, wherein the step of annealing said semiconductor substrate is accomplished by subsequent fabrication processing such that said annealing requires no dedicated processing step.

11. In a process for manufacturing integrated circuits, an isolation method comprising:
providing a silicon substrate, wherein said silicon substrate comprises an isolation region laterally displaced between first and second active regions;
depositing a pad oxide layer on an upper surface of said silicon substrate;
depositing a silicon nitride layer on said pad oxide layer;
forming a patterned photoresist layer on said silicon nitride layer, wherein said patterned photoresist layer is aligned over said active regions of said silicon substrate;

implanting oxygen through said silicon nitride layer and said pad oxide layer into said isolation regions of said silicon substrate; and annealing said silicon substrate to react said oxygen with said silicon substrate within said isolation regions of said silicon substrate, to form an isolation oxide in said isolation region.

12. The process of claim 11, wherein the step of providing said silicon substrate, comprises providing a p-type epitaxial layer formed on a p+ silicon bulk and wherein a resistivity of said p+ silicon bulk is in the range of approximately 10 to 15 Ω-cm.

13. The process of claim 11, wherein the step of depositing said pad oxide layer comprises decomposing TEOS in a chemical vapor depositing reactor chamber maintained at a temperature in the range of approximately 650 to 800° C.

14. The process of claim 11, wherein the step of depositing said silicon nitride layer comprises decomposing silane and $NH_3$ in a chemical vapor depositing reactor chamber maintained at a temperature in the range of approximately 700 to 900° C.

15. The process of claim 11, wherein the step of implanting said oxygen is accomplished using an implant energy in the range of approximately 10 to 100 keV.

16. The process of claim 11, wherein the step of implanting said oxygen is accomplished using an implant dose of approximately $10^{13}$ to $10^{17}$ atoms/cm$^2$.

17. The process of claim 11, wherein the step of annealing said silicon substrate comprises immersing said silicon substrate in a nitrogen bearing ambient maintained at a temperature in the range of approximately 600 to 900° C. for approximately 2 to 20 minutes.

18. The process of claim 11, wherein the step of annealing said silicon substrate is accomplished during formation of first and second transistors in said first and second active region of said silicon substrate such that said annealing requires no dedicated processing step.

19. A semiconductor isolation method, comprising:

selectively implanting an oxygen bearing species into an isolation region of a silicon substrate; and annealing said silicon substrate to react with said oxygen bearing species to form a silicon-oxide isolation structure, wherein said annealing said silicon substrate is accomplished during forming first and second transistors in first and second active regions, respectively, of said silicon substrate.

20. The method of claim 19, wherein said selectively implanting an oxygen bearing species comprises selectively implanting the oxygen bearing species through a barrier layer.

21. The method of claim 1, wherein said annealing said semiconductor substrate is performed while maintaining said barrier layer directly above the entirety of said isolation region.

22. The method of claim 1, wherein said isolation structure is substantially contained within said isolation region of said semiconductor substrate.

23. The method of claim 11, wherein said annealing said silicon substrate is performed while maintaining said silicon nitride layer directly above the entirety of said isolation region.

24. The method of claim 11, wherein said isolation oxide is substantially contained within said isolation region of said silicon substrate.

* * * * *